US008050108B2

(12) United States Patent
Shimogawa et al.

(10) Patent No.: US 8,050,108 B2
(45) Date of Patent: Nov. 1, 2011

(54) SEMICONDUCTOR MEMORY DEVICE AND SEMICONDUCTOR MEMORY DEVICE OPERATION METHOD

(75) Inventors: Kenjiyu Shimogawa, Kanagawa (JP); Hiroshi Furuta, Kanagawa (JP); Shunsaku Naga, Kanagawa (JP); Takayuki Shirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 199 days.

(21) Appl. No.: 12/611,589

(22) Filed: Nov. 3, 2009

(65) Prior Publication Data

US 2010/0110814 A1    May 6, 2010

(30) Foreign Application Priority Data

Nov. 5, 2008  (JP) .................................. 2008-284659

(51) Int. Cl.
*G11C 7/10* (2006.01)
(52) U.S. Cl. .................................. 365/189.04; 365/207
(58) Field of Classification Search ............. 365/189.04, 365/189.11, 207, 194
See application file for complete search history.

(56) References Cited

U.S. PATENT DOCUMENTS

| 6,061,297 | A  | * | 5/2000 | Suzuki ....................... 365/238.5 |
| 6,337,810 | B1 | * | 1/2002 | Yamasaki et al. ........ 365/189.05 |
| 2003/0133346 | A1 |   | 7/2003 | Honda |
| 2003/0169071 | A1 | * | 9/2003 | Nozawa et al. ................. 326/38 |
| 2008/0094928 | A1 | * | 4/2008 | Yokoyama ..................... 365/205 |

FOREIGN PATENT DOCUMENTS

| JP | 2003-272390 A | 9/2003 |
| JP | 2007-157283 A | 6/2007 |

* cited by examiner

*Primary Examiner* — Andy Phung
(74) *Attorney, Agent, or Firm* — Foley & Lardner LLP

(57) ABSTRACT

Provided is a destructive readout semiconductor memory device capable of avoiding concentration of a writeback current, in which a switch circuit (24) is provided between each bit line (21) and each sense amplifier (26). In writeback, the switch circuits are turned on at staggered time points. In readout, the switch circuits are turned on to read memory cell data to the sense amplifiers while the sense amplifiers are turned off, and the switch circuits are then turned off once. After that, the sense amplifiers are turned on to amplify the read data. The switch circuits are subsequently divided into groups and turned on again to write back the data amplified by the sense amplifiers to the memory cells. The switch circuits are divided into groups to be turned on at staggered time points during the writeback, to thereby avoid concentration of the writeback current in one time period.

9 Claims, 12 Drawing Sheets

US 8,050,108 B2

SEMICONDUCTOR MEMORY DEVICE AND SEMICONDUCTOR MEMORY DEVICE OPERATION METHOD

BACKGROUND OF THE INVENTION

1. Field of the Invention

The present invention relates to a semiconductor memory device. More particularly, the present invention relates to a destructive readout semiconductor memory device such as a dynamic random access memory or a ferroelectric memory which needs to write back data after the data is read.

2. Description of the Related Art

Included among known semiconductor memories are destructive readout semiconductor memories such as dynamic random access memories (DRAMs) and ferroelectric memories which lose data of a memory cell once the data is readout of the memory cell. Semiconductor memories of this type need a writeback (refresh) operation executed at the same time as data readout, in the case where data is to be retained after readout.

A readout operation of these destructive readout semiconductor memories is described taking a DRAM as an example.

FIG. 10 is a block diagram of a common DRAM. In FIG. 10, a hundred and twenty-eight memory cells 1-1 are connected to one word line 3, and a sense amplifier 26 is connected to the tip of each bit line 21. The sense amplifier 26 is enabled with an enable signal SE. With a bit line selecting signal YSW, a specific bit line is selected, and data read out of a cell and amplified by the bit line's sense amplifier 26 is propagated to a local I/O bus 15 to be input to a data amplifier (DAMP) 9.

Readout of memory cell data is executed by the sense amplifiers 26 illustrated in FIG. 11. Each sense amplifier 26 has two bit lines connected thereto. Data read out of a memory cell is input via one of the two bit lines whereas a voltage that serves as a reference voltage is input to the other bit line. The sense amplifier 26 amplifies an electric potential difference between the voltage read out of the memory cell and the reference voltage, to thereby establish whether the data logic is "H" or "L."

FIG. 12 illustrates an operation timing chart. After a word line is selected, the sense amplifier enable signal SE rises to enable the sense amplifier 26, which proceeds to amplify data. A bit line is then selected with the bit line selecting signal YSW, and the data is read to the outside. Reading the data to the bit line 21 causes the memory cell 1-1 to lose accumulated electric charges, but the data is amplified by the sense amplifier 26 which has been enabled with the sense amplifier enable signal SE, and the data amplified by the sense amplifier 26 is written back via the bit line 21 to the original memory cell from which the data has been read. The memory cell can thus keep the same data after readout. Current consumption peaks after the sense amplifier is enabled.

Aside from destructive readout semiconductor memories which have been described above, some semiconductor memories need to read a plurality of bits concurrently. In such semiconductor memories, a number of sense amplifiers that is determined by the number of bits required to be read concurrently operate at the same time. One bit line is connected to one sense amplifier and, consequently, putting a large number of sense amplifiers in operation at once means that as many bit lines as the operating sense amplifiers are charged concurrently. This increases current consumption instantly, and causes a voltage drop and power supply noise.

JP 2003-272390 A (Patent Document 1) avoids this instant increase in current consumption due to simultaneous operation of sense amplifiers by dividing cells of a memory where data is read in pages into a plurality of groups to constitute a plurality of sense amplifier groups, and then staggering the operation start time of these sense amplifier groups instead of allowing the sense amplifier groups to start operating simultaneously. The peak current registered at the time the sense amplifiers start operating is thus lowered.

JP 2007-157283 A (Patent Document 2) discloses a semiconductor memory device with a synchronous readout function in which sense amplifiers are divided into a plurality of groups and each group staggers the operation timing of its sense amplifiers by timing the sense amplifiers' operation with clock signals. The peak current registered at the time the sense amplifiers are put into operation is thus lowered.

As mentioned above, destructive readout semiconductor memories need writeback executed at the same time as readout. Even if a destructive readout semiconductor memory device executes readout with sense amplifiers divided into groups as in Patent Documents 1 and 2 described above, an operating current for data readout and a bit line charging current for writeback are generated concurrently as soon as the sense amplifiers in the groups start operating. The peak current is therefore not lowered enough.

SUMMARY OF THE INVENTION

A semiconductor memory device according to one aspect of the present invention includes: a plurality of word lines; a plurality of bit lines which are provided in a direction intersecting the plurality of word lines; a plurality of memory cells which are arranged in a matrix pattern that corresponds to intersections between the plurality of word lines and the plurality of bit lines; a plurality of sense amplifiers which are associated with the plurality of bit lines on a one-on-one basis; a plurality of switch circuits each of which belongs to one of first to n-th (n is an integer equal to or larger than 2) groups, and which are associated with the plurality of bit lines and with the plurality of sense amplifiers on a one-on-one basis, each switch circuit connecting its associated bit line and sense amplifier to each other when turned on; and a timing control section for controlling at least timing of the sense amplifiers and the switch circuits which, in reading stored data out of the memory cells, executes control in which the plurality of sense amplifiers are disabled while the plurality of switch circuits are turned on for a given period of time, the plurality of switch circuits are turned off and then the plurality of sense amplifiers are enabled, and, when a given period of time elapses since the relevant sense amplifiers are enabled, the switch circuits belonging to the first to n-th groups are sequentially turned on group by group at given time intervals.

Further, an operation method of a semiconductor memory device according to another aspect of the present invention includes: a plurality of word lines; a plurality of bit lines which are provided in a direction intersecting the plurality of word lines; a plurality of memory cells which are arranged in a matrix pattern that corresponds to intersections between the plurality of word lines and the plurality of bit lines; a plurality of sense amplifiers which are associated with the plurality of bit lines on a one-on-one basis; and a plurality of switch circuits which, when turned on, connect the plurality of bit lines and the plurality of sense amplifiers to each other, the method including: disabling the plurality of sense amplifiers while turning on the plurality of switch circuits for a given period of time; turning off the plurality of switch circuits and then enabling the plurality of sense amplifiers; and when a given period of time elapses since the sense amplifiers are enabled, dividing the plurality of switch circuits into a plurality of groups, so that the switch circuits are sequentially turned on group by group at given time intervals.

According to the present invention, a sense amplifier is enabled while a switch circuit provided between a bit line and the sense amplifier is turned off, which means that the sense amplifier can amplify data read out of the bit line without a charging current flowing into the bit line. Furthermore, bit line charging for writeback is executed for each group separately. Accordingly, the peak of a data readout current and the peak of a group-by-group bit line charging current are dispersed, with the result that the peak current in readout is lowered.

DETAILED DESCRIPTION OF THE PREFERRED EMBODIMENTS

Figure 1:
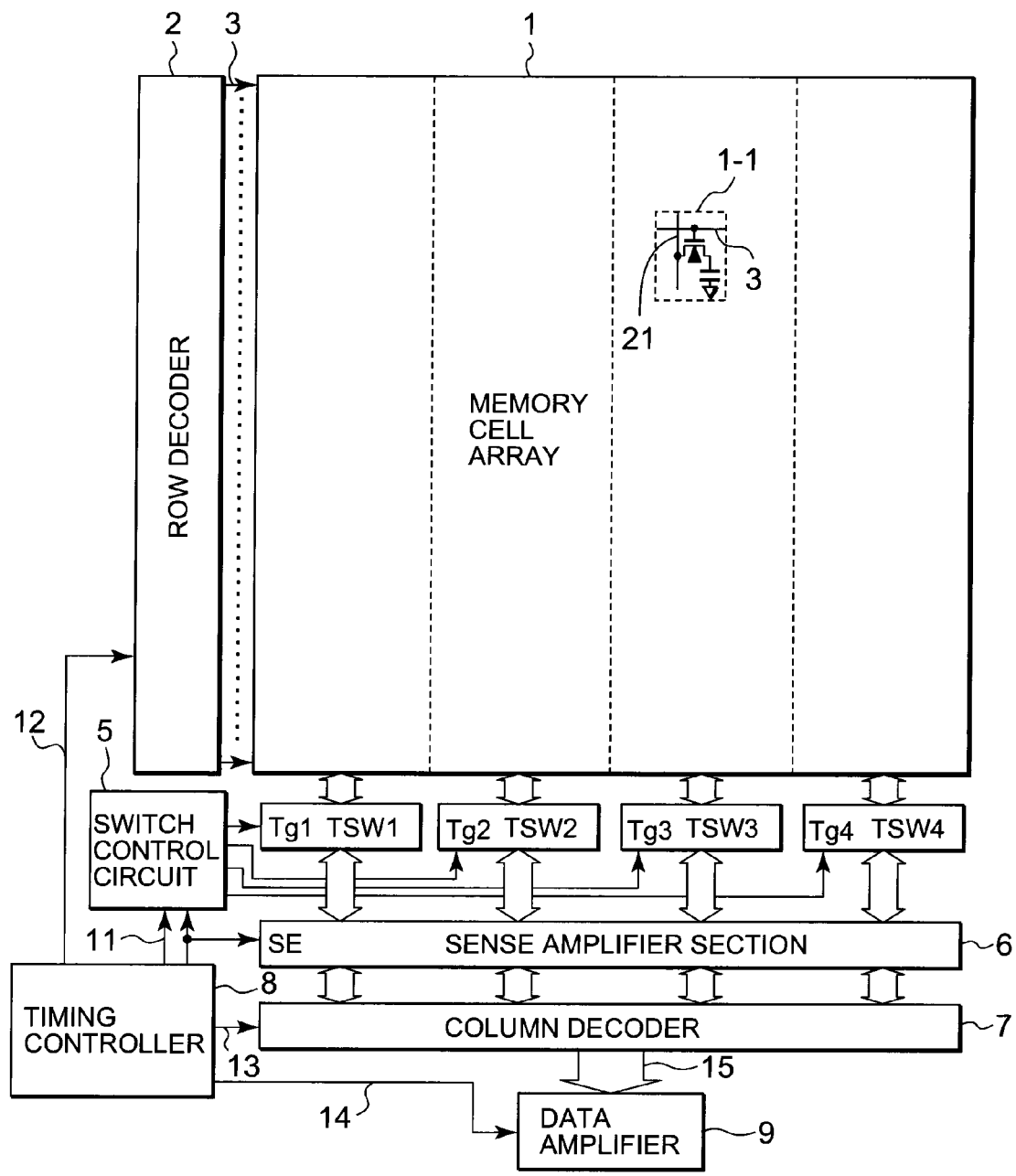
FIG. 1 is a block diagram illustrating an entirety of a semiconductor memory device according to a first embodiment of the present invention.

An embodiment mode of the present invention is described with, when necessary, reference to the drawings.

A semiconductor memory device according to the embodiment mode of the present invention includes, for example, as illustrated in FIGS. 1, 2, 7, and 8, a plurality of word lines 3, a plurality of bit lines 21, a plurality of memory cells 1-1, a plurality of sense amplifiers 26, a plurality of switch circuits 24, and a timing control section (including 5 or 55 and 8). The plurality of bit lines 21 run in a direction that intersects the plurality of word lines 3. The plurality of memory cells 1-1 are arranged in a matrix pattern that corresponds to the intersections between the plurality of word lines 3 and the plurality of bit lines 21. The plurality of sense amplifiers 26 are associated with the plurality of bit lines 21 on a one-on-one basis. The plurality of switch circuits 24 each belong to one of the first to n-th (n is an integer equal to or larger than 2) groups TSWs (here, TSW1, TSW2, TSW3, and TSW4). The plurality of switch circuits 24 are associated with the plurality of bit lines 21 and with the plurality of sense amplifiers 26 on a one-on-one basis. When turned on, each switch circuit 24 connects its associated bit line 21 and sense amplifier 26 to each other. The timing control section (including 5 or 55 and 8) controls at least the timing of the sense amplifiers 26 and the switch circuits 24. In reading stored data out of the memory cells 1-1, the timing control section (including 5 or 55 and 8) executes control in which the plurality of sense amplifiers 26 are disabled while the plurality of switch circuits 24 are turned on for a given period of time (t0 to t1 in FIGS. 3 to 5 and FIG. 9), the plurality of switch circuits 24 are subsequently turned off and then the plurality of sense amplifiers 26 are enabled (a rise of SE in FIGS. 3 to 5 and FIG. 9), and, when a given period of time elapses since the relevant sense amplifiers 26 are enabled, the switch circuits 24 belonging to the first to n-th groups are sequentially turned on group by group at given time intervals (the second rises of Tg1 to Tg4 in FIGS. 3 to 5 and FIG. 9).

In the structure described above, the sense amplifiers 26 are disabled while the switch circuits 24 are turned on long enough to transmit bit line electric potentials to the sense amplifiers 26, and then the sense amplifiers 26 are enabled with the switch circuits 24 turned off. No charging current therefore flows in the bit lines 21 when data amplified by the sense amplifiers 26 is read to the outside. This lowers the peak current registered when the sense amplifiers 26 start amplification to read data and, in addition, speeds up data amplification and data readout. This also makes it possible to write back to the bit lines 21 by turning on the switch circuits 24 group by group after the sense amplifiers 26 are enabled and the peak current in the readout operation drops down. In addition, the switch circuits 24 can be turned on at time intervals in a manner that prevents writeback currents for group-by-group writeback from concentrating in one time period, which lowers the peak current.

Figure 5:
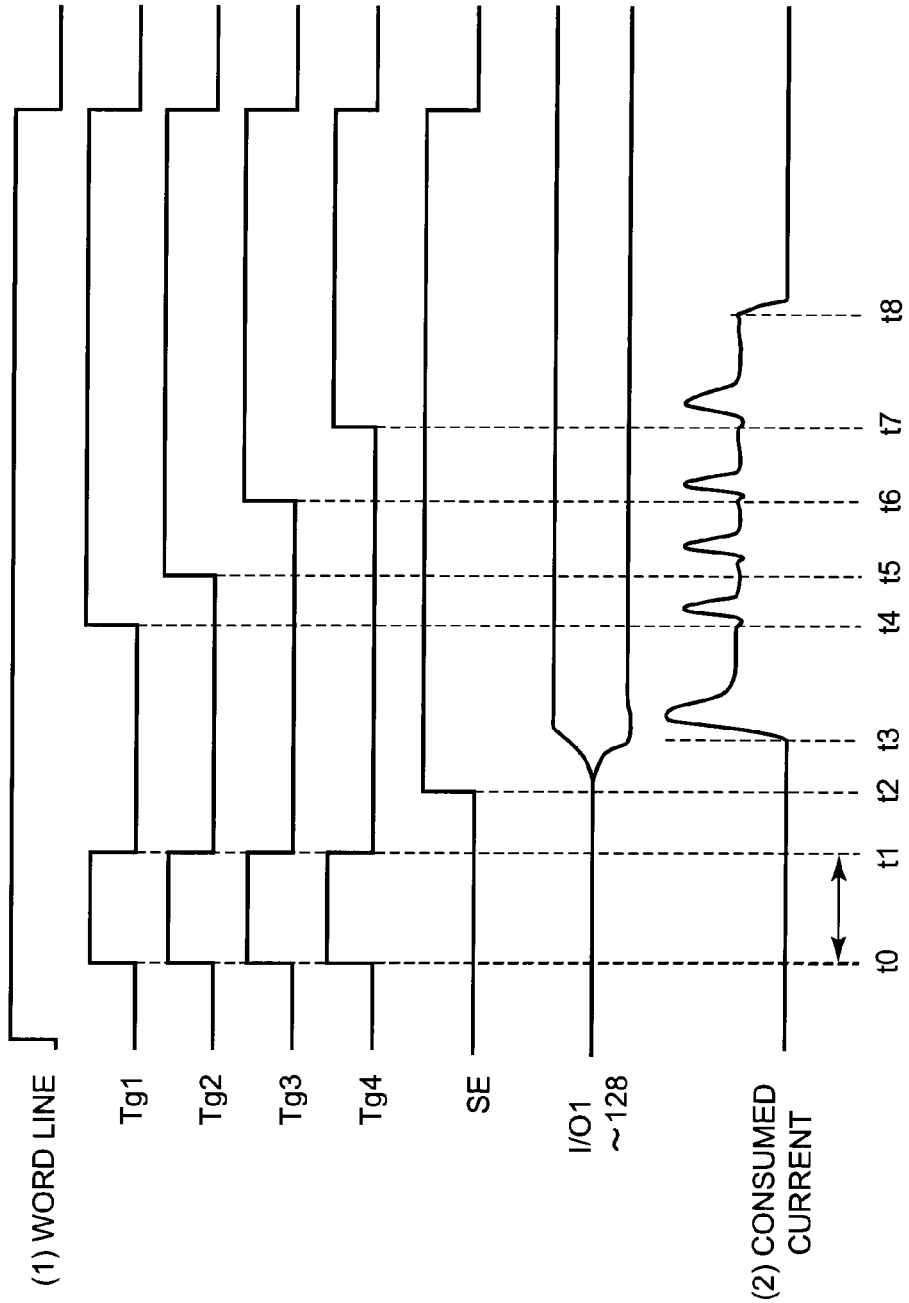
FIG. 5 is a timing chart of a semiconductor memory device according to a third embodiment of the present invention.
Figure 6:
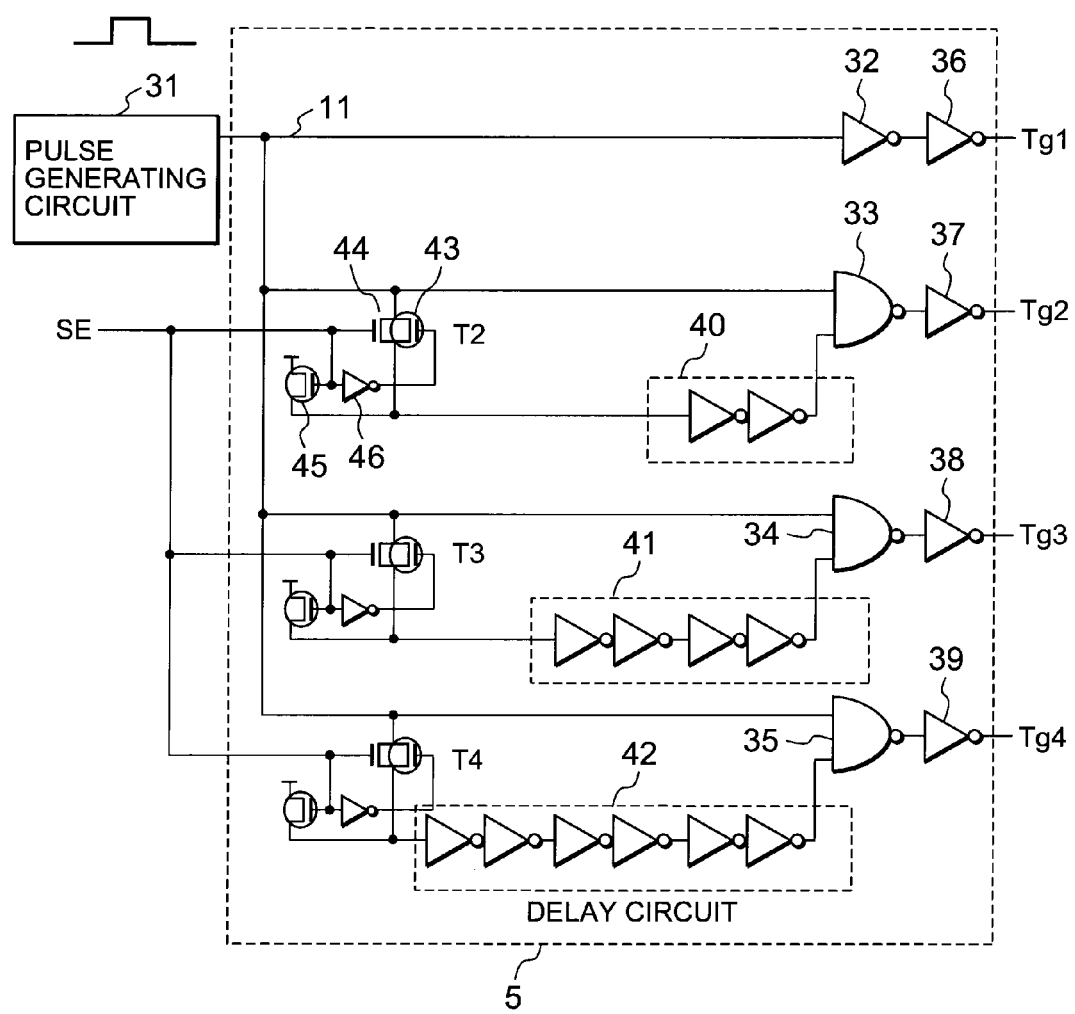
FIG. 6 is a block diagram of a switch control circuit of the semiconductor memory device according to the third embodiment of the present invention.

Further, a semiconductor memory device according to an embodiment mode of the present invention may execute control in which, for example, as mainly illustrated in the block diagram of FIG. 6 and the timing chart of FIG. 5, when a given period of time elapses since the sense amplifiers 26 are enabled, the switch circuits 24 belonging to the first to n-th groups are sequentially turned on group by group at given time intervals, and, when a given period of time elapses since the switch circuits that belong to the last group TSW4 are turned on (t7 of FIG. 5), the switch circuits 24 belonging to the first to n-th groups are turned off (the second falls of Tg1 to Tg4 of FIG. 5).

Currents that charge the bit lines 21 peak when the switch circuits 24 are turned on after the sense amplifiers 26 amplify data. Accordingly, despite the switch circuits 24 being turned off at the same time, the peak current can be lowered by varying the time to turn on the switch circuits 24 from group to group.

Figure 3:
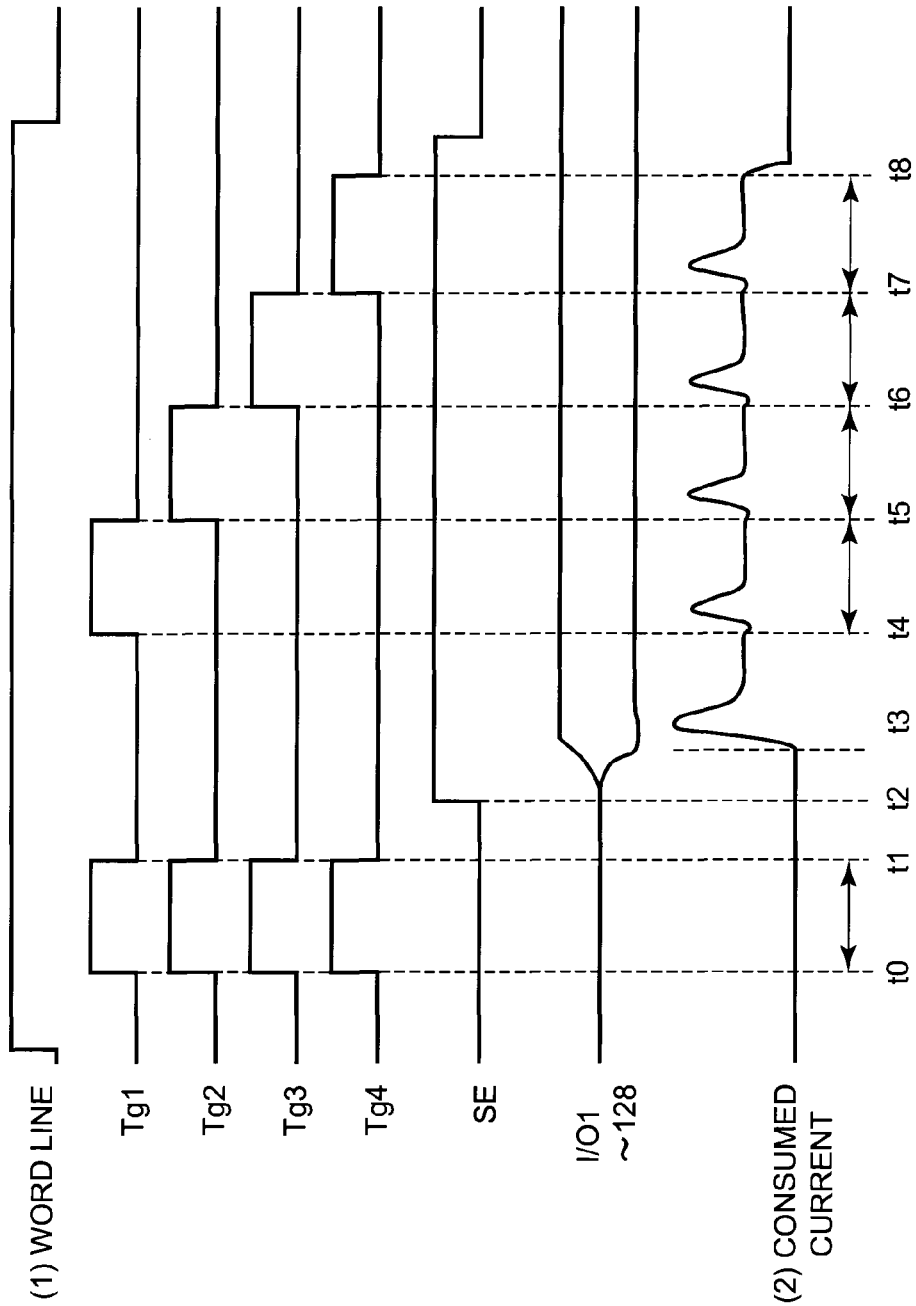
FIG. 3 is a timing chart of the semiconductor memory device according to the first embodiment of the present invention.
Figure 9:
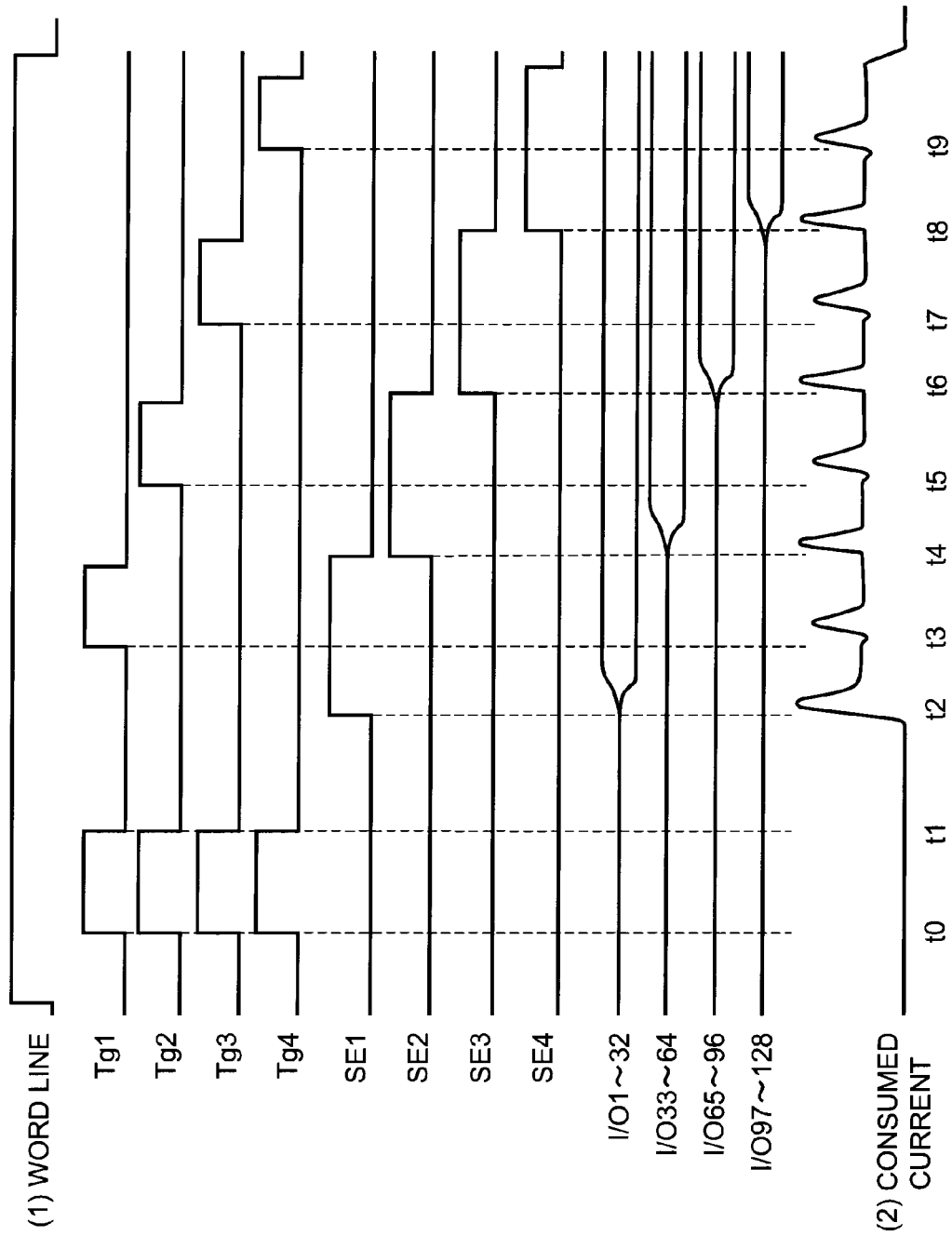
FIG. 9 is a timing chart of the semiconductor memory device according to the fourth embodiment of the present invention.
Figure 10:
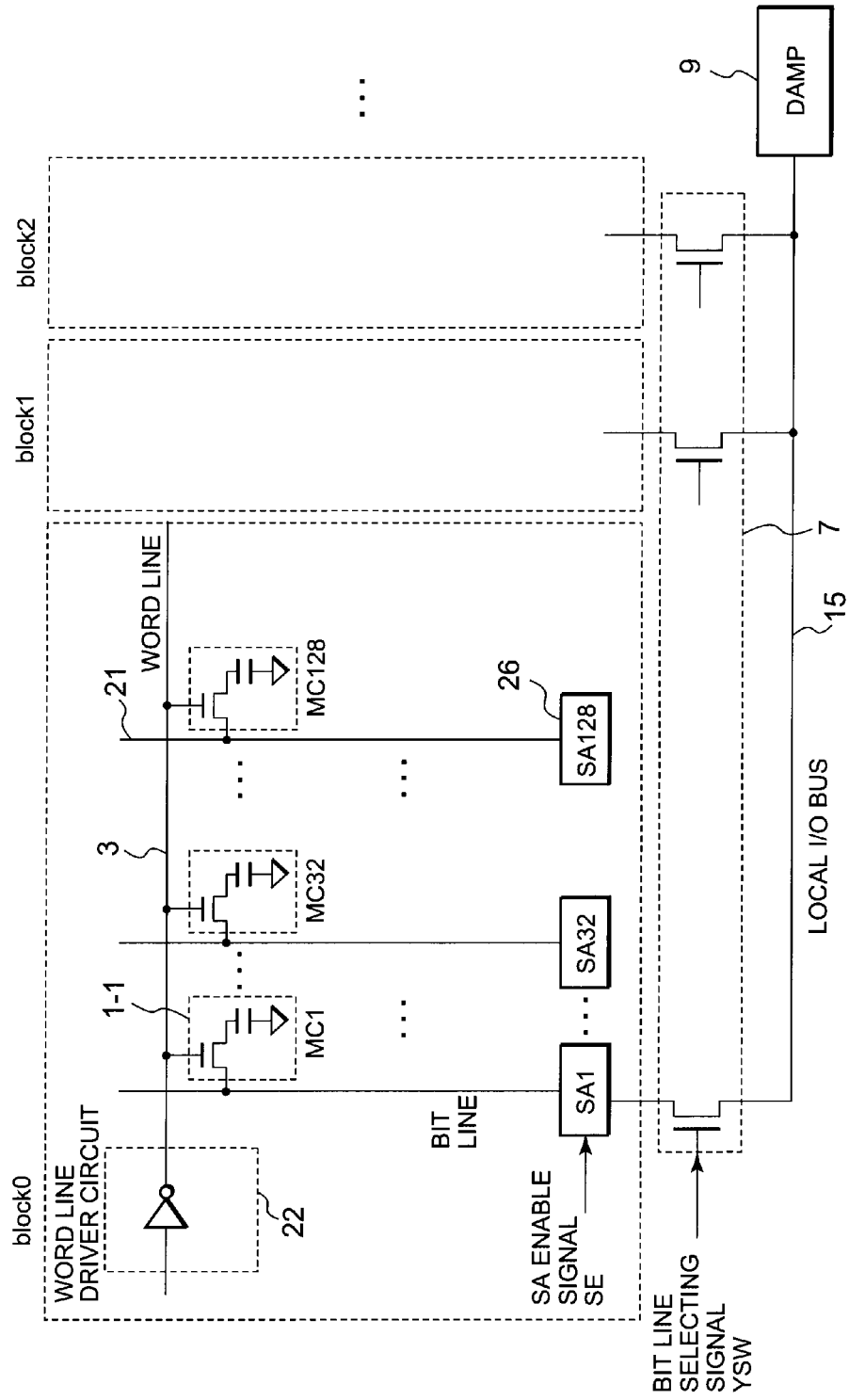
FIG. 10 is a block diagram of a conventional semiconductor memory device.
Figure 11:
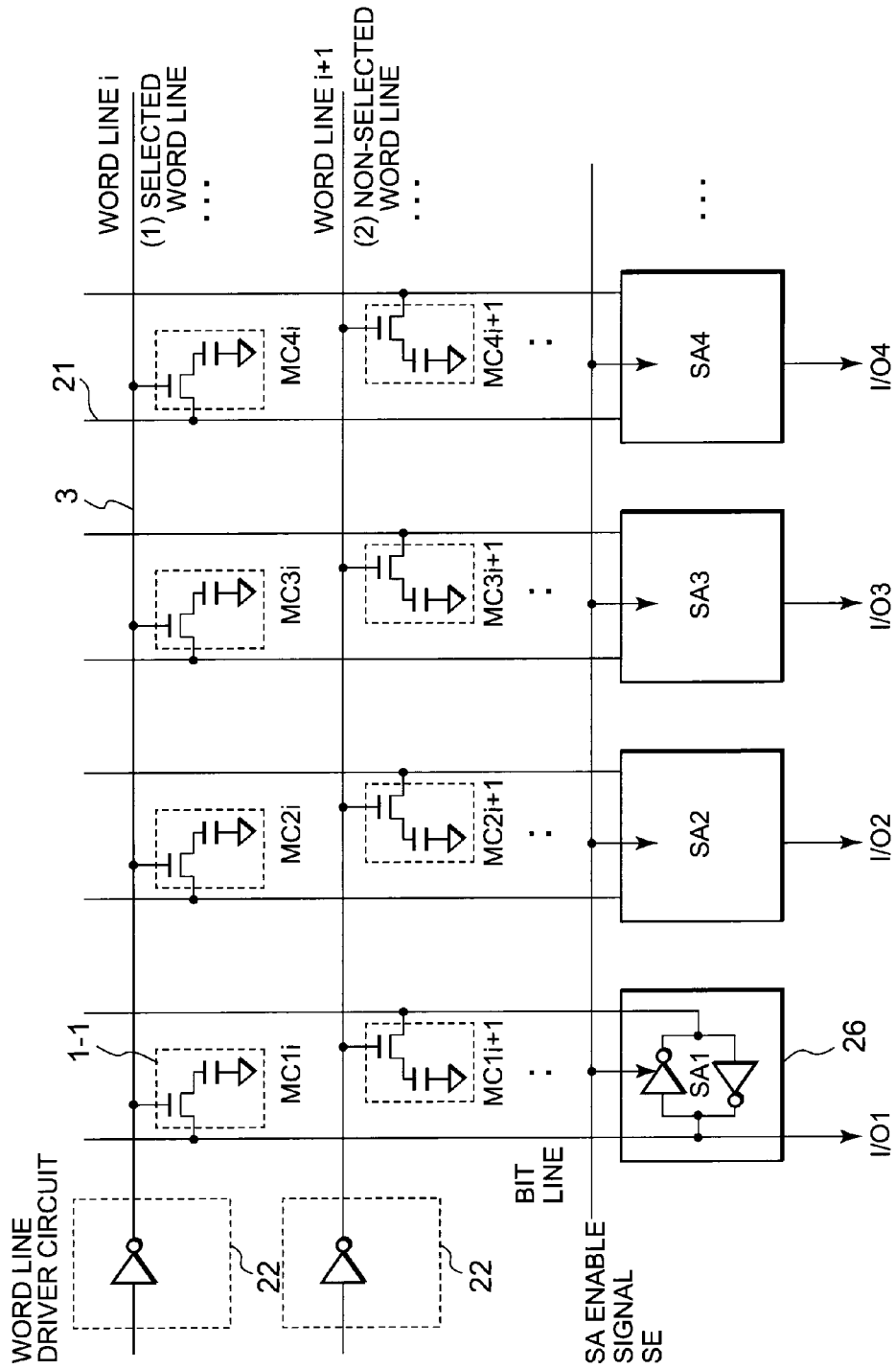
FIG. 11 is a block diagram illustrating a main part of a conventional semiconductor memory device.
Figure 12:
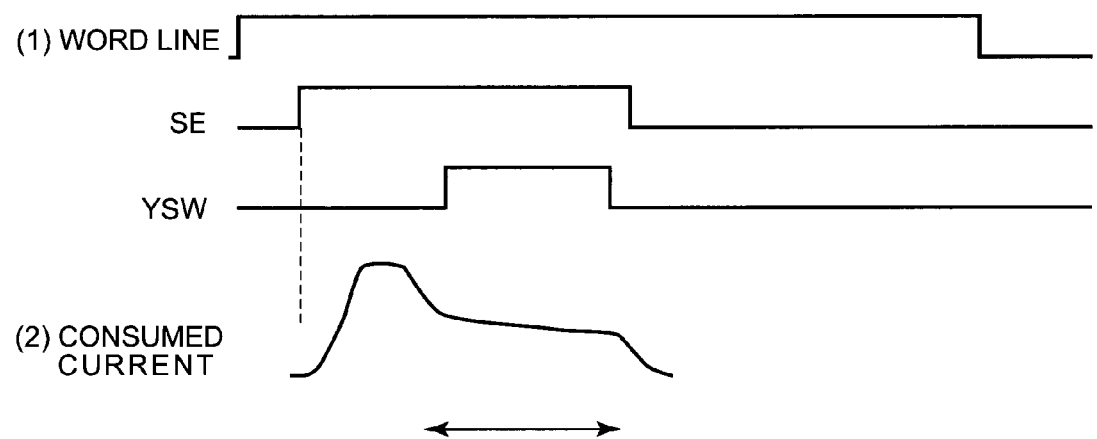
FIG. 12 is a timing chart of a conventional semiconductor memory device.

A semiconductor memory device according to an embodiment mode of the present invention may execute control in which, for example, as illustrated in the timing charts of FIGS. 3 and 9, in turning on the switch circuits belonging to the first to n-th groups sequentially group by group at given time intervals, the switch circuits of a preceding group are turned off before the switch circuits of the next group are turned on, so that a time period in which the switch circuits of one group are on is prevented from overlapping with a time period in which the switch circuits of another group is on.

Figure 7:
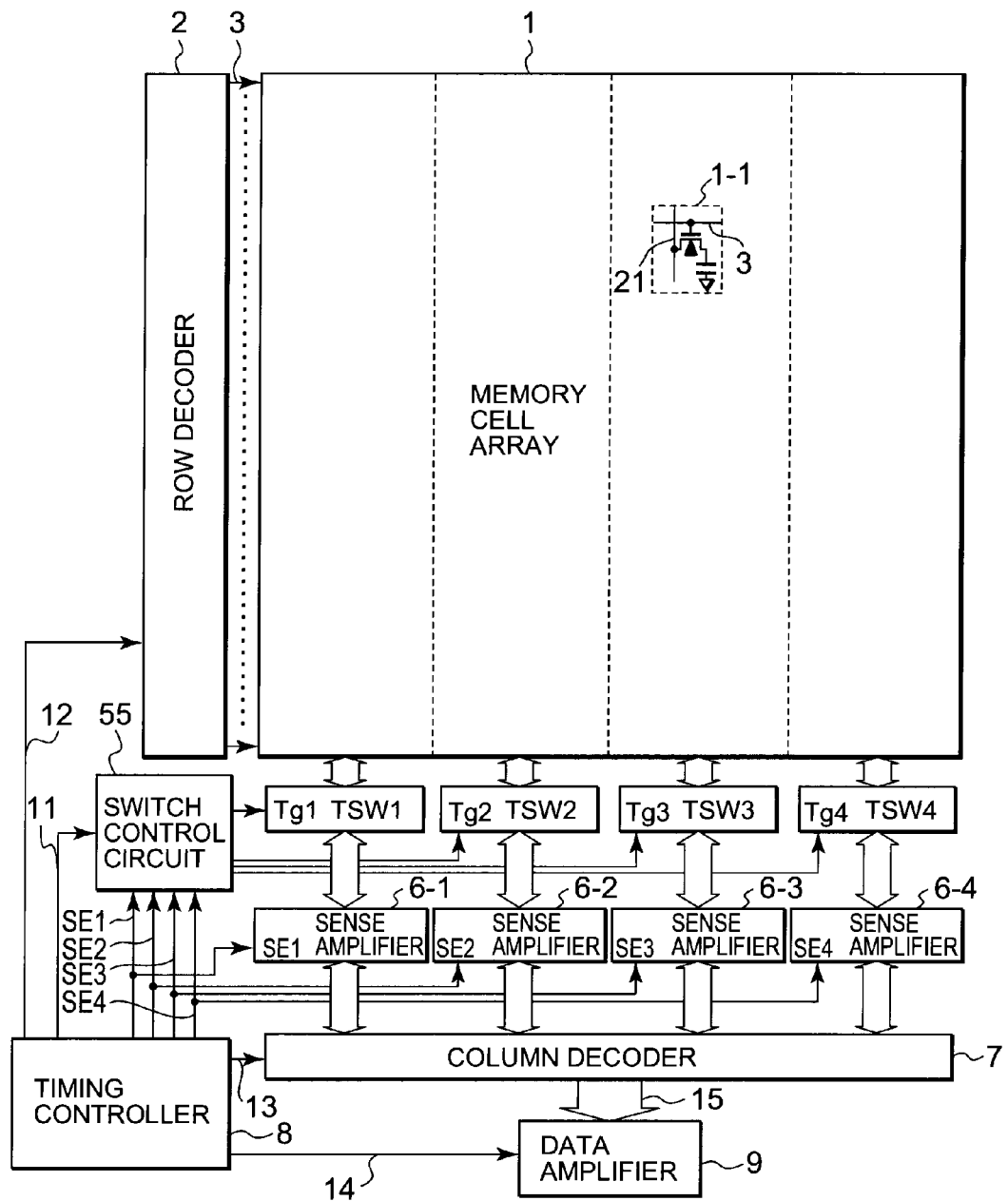
FIG. 7 is a block diagram illustrating an entirety of a semiconductor memory device according to a fourth embodiment of the present invention.
Figure 8:
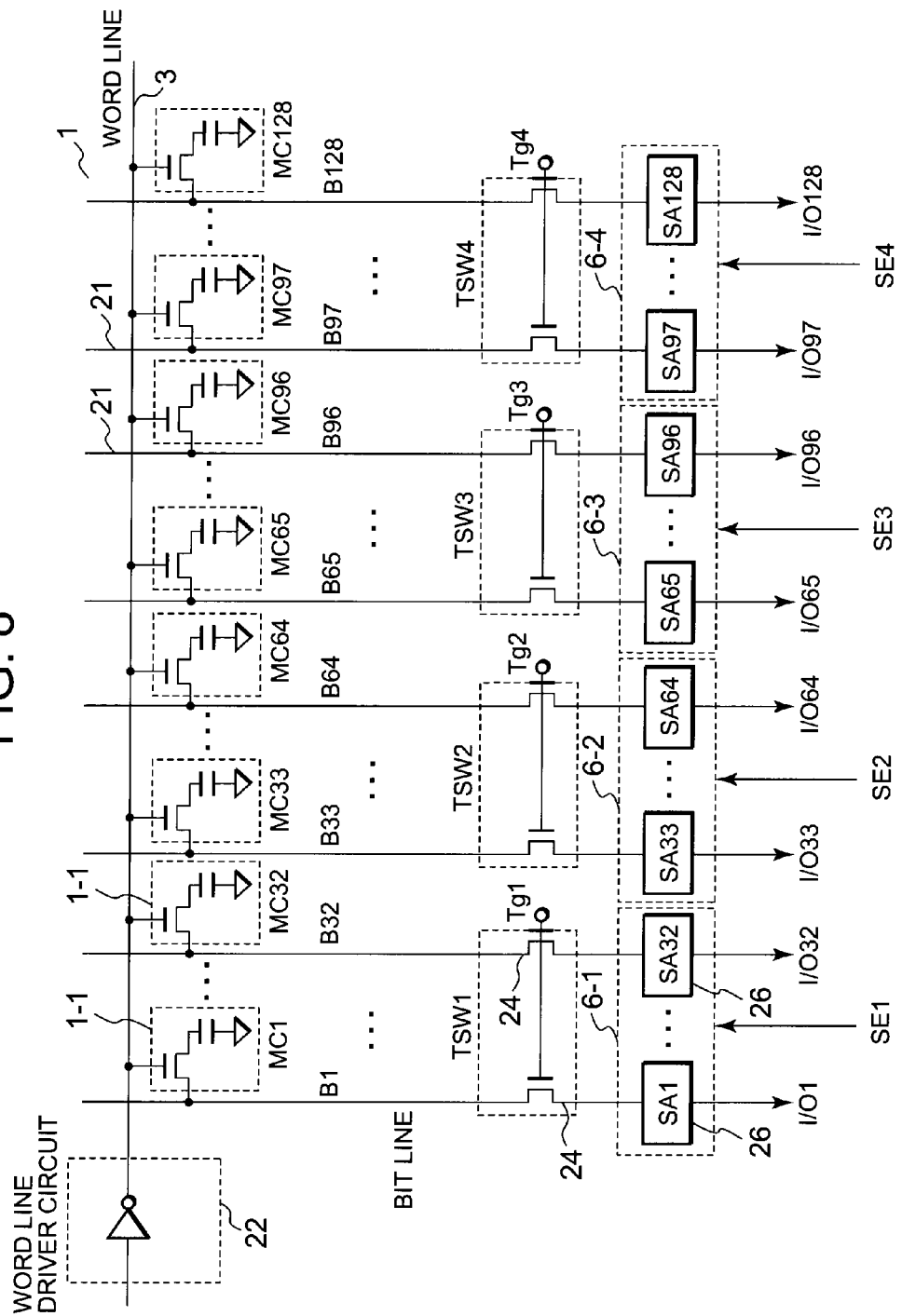
FIG. 8 is a block diagram illustrating a main part of the semiconductor memory device according to the fourth embodiment of the present invention.

In a semiconductor memory device according to an embodiment mode of the present invention, for example, as illustrated in the block diagrams of FIGS. 7 and 8 and the timing chart of FIG. 9, each of the plurality of sense amplifiers 26 belongs to one of first to n-th groups (6-1, 6-2, 6-3, and 6-4) that corresponds to the switch circuit group (TSW1, TSW2, TSW3, and TSW4) of its associated switch circuit 24, and the timing control section (8, 55) may execute control in which, after the plurality of switch circuits 24 are turned off (time point t1 of FIG. 9), the sense amplifiers are sequentially enabled group by group (6-1, 6-2, 6-3, and 6-4) at given time intervals (time points t2, t4, t6, and t8 of FIG. 9) and, when a given period of time elapses since the sense amplifiers of one group are enabled (time points t2, t4, t6, and t8 of FIG. 9), the switch circuits 24 of the corresponding group are turned on (time points t3, t5, t7, and t9 of FIG. 9).

This way, not only the peak of a bit line charging current but also a peak current caused by cell data readout itself can be dispersed among groups. The peak current is thus lowered even more.

Further, in a semiconductor memory device according to an embodiment mode of the present invention, in sequentially enabling the sense amplifiers group by group at given time intervals, the timing control section may turn off the sense amplifiers and switch circuits belonging to a group whose sense amplifiers are previously enabled, and then enables the sense amplifiers of the next group.

With this structure, an overlap between a readout current for one group and a readout current for another group may be avoided. The peak current in a readout operation is thus lowered even more.

Figure 2:
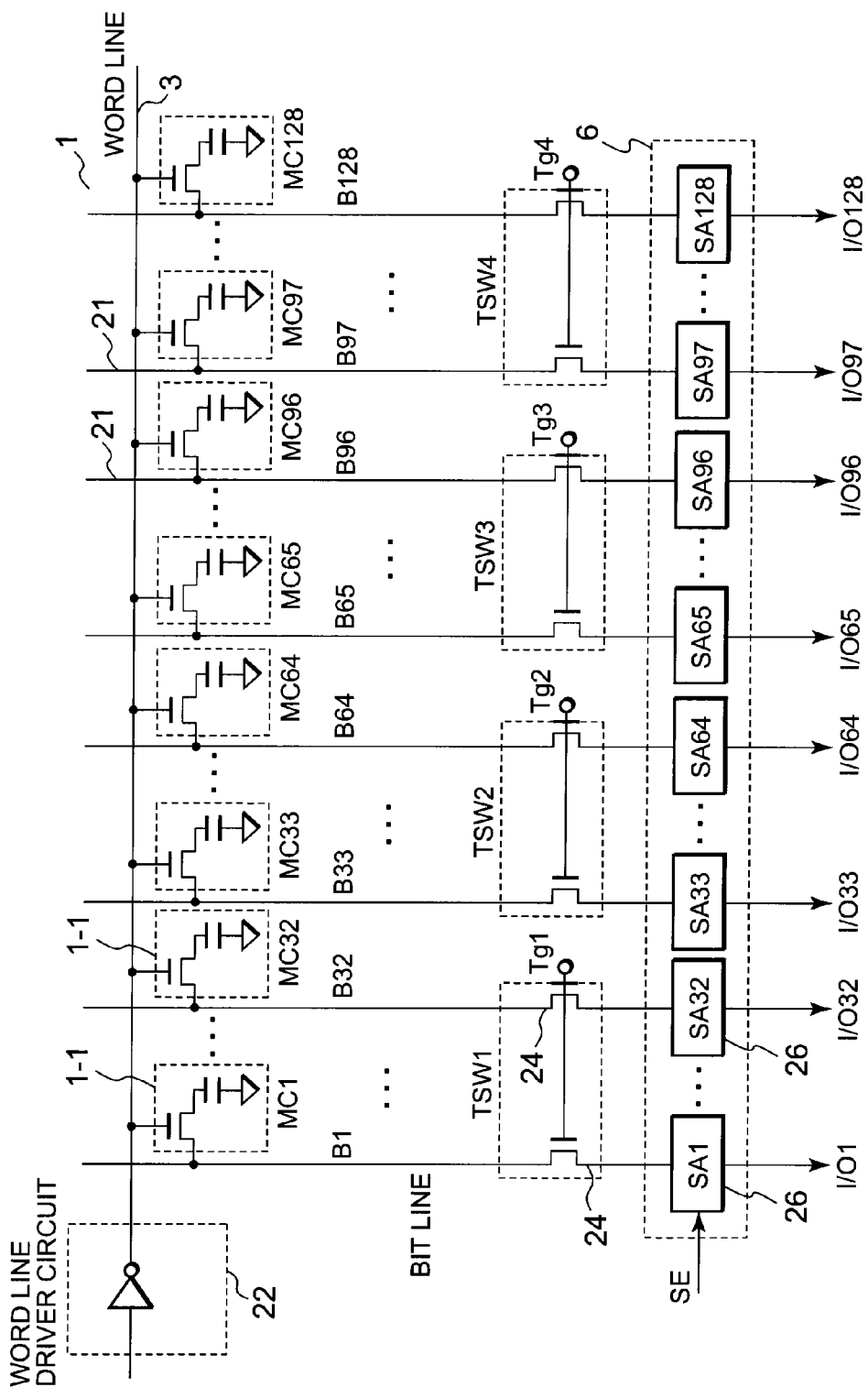
FIG. 2 is a block diagram illustrating a main part of the semiconductor memory device according to the first embodiment of the present invention.

A semiconductor memory device according to an embodiment mode of the present invention may include, for example, a dynamic random access memory as illustrated in the block diagrams of FIGS. 2 and 8.

In a semiconductor memory device according to an embodiment mode of the present invention, for example, as illustrated in block diagrams of FIGS. 1, 6 and 7, the timing control section includes a timing controller 8 and a switch control circuit (5 of FIG. 1 or 55 of FIG. 7), the timing controller 8 generates a sense amplifier enable signal 8E, which controls enabled/disabled state of the sense amplifiers 26, and a switch control pulse 11, which serves as a reference for on/off of the switch circuits 24, and the switch control circuit (5, 55) controls the on/off of the plurality of switch circuits group by group, based on the sense amplifier enable signal SE and the switch control pulse 11.

Further, an operation method of a semiconductor memory device according to an embodiment mode of the present invention includes, for example, as illustrated in the block diagrams of FIGS. 1, 2, 7, and 8, and the timing charts of FIGS. 3 to 5, and 9, an operation method of a semiconductor memory device that includes a plurality of word lines 3, a plurality of bit lines 21 which are provided in a direction intersecting the plurality of word lines 3, a plurality of memory cells 1-1 which are arranged in a matrix pattern that corresponds to intersections between the plurality of word lines 3 and the plurality of bit lines 21, a plurality of sense amplifiers 26 which are associated with the plurality of bit lines 21 on a one-on-one basis, and a plurality of switch circuits 24 which, when turned on, connect the plurality of bit lines 21 and the plurality of sense amplifiers 26 to each other. The method includes: disabling the plurality of sense amplifiers 26 while turning on the plurality of switch circuits 24 for a given period of time (t0 to t1 of FIGS. 3 to 5, and 9), turning off the plurality of switch circuits 24 and then enabling the plurality of sense amplifiers 26 (a rise of SE of FIGS. 3 to 5, and 9), and when a given period of time elapses since the sense amplifiers 26 are enabled, dividing the plurality of switch circuits into a plurality of groups, so as to sequentially turn on the switch circuits group by group at given time intervals (the second rises of Tg1 to Tg4 of FIGS. 3 to 5, and 9).

According to the operation method described above, data can be read out at high speed while accomplishing current dispersion as opposed to allowing current concentration during the readout.

Further, in an operation method of a semiconductor memory device according to an embodiment mode of the present invention, the semiconductor memory device may include a destructive readout semiconductor memory device, and the operation may include a readout operation and a data writeback operation which accompanies the readout operation.

That is, in a destructive readout memory cell such as a DRAM where data of a memory cell is destroyed once the data is read out of the memory cell, in order to retain data of a memory cell after readout, it is necessary to perform writeback processing such as refresh. In the embodiment modes according to the present invention described above, sense amplifiers are first disabled and switch circuits provided between bit lines and the sense amplifiers are turned on to transmit bit line electric charges to the sense amplifiers, then the switch circuits are turned off once to disconnect the sense amplifiers and the bit lines, and then the sense amplifiers are enabled. This prevents the bit lines from being a burden during an amplification and readout operation executed by the sense amplifiers, and high-speed amplification and readout operation is thus accomplished. Further, the bit lines are subsequently divided into groups to be charged for writeback to memory cells group by group. This causes a current that accompanies the amplification and readout operation executed by the sense amplifiers and a current that charges the bit lines for writeback group by group to flow at dispersed time points, thereby avoiding current concentration in one time period. In addition, writeback processing can be executed in parallel with processing of outputting data that has been read to the sense amplifiers to outside. Executing writeback by time division therefore does not prolong the access time or the like of the semiconductor memory device.

A detailed description of the present invention is given below based on embodiments with reference to the drawings.

First Embodiment

FIG. 1 is a block diagram illustrating the entirety of a semiconductor memory device according to a first embodiment of the present invention. FIG. 1 illustrates only one memory cell 1-1 and omits other memory cells. However, in FIG. 1, a large number of word lines 3 run from a row decoder 2 in a lateral direction of a memory cell array 1, and a large number of bit lines 21 run in a longitudinal direction, which intersects the large number of word lines 3. The memory cell 1-1 is placed at each of intersections between the large number of word lines 3 and the large number of bit lines 21. The memory cell 1-1 is a dynamic random access memory cell which accumulates electric charges in a capacitor. Switch circuit groups TSW1, TSW2, TSW3, and TSW4 are placed in the bit line direction of (below) the memory cell array 1, and contain a large number of switch circuits that matches the number of the bit lines 21. The memory cell array 1 is connected to a sense amplifier section 6 via the switch circuit groups TSW1 to TSW4.

The sense amplifier section 6 is also connected to a column decoder 7, which is connected to a data amplifier 9 via a local I/O bus 15. The column decoder 7 receives an input of a column selecting signal 13 and a column address (not shown) to send to the data amplifier 9 data to be output to the outside, of data amplified by the sense amplifier section 6.

A timing controller 8 is a circuit block that imparts operation timing to the entire semiconductor memory device. The timing controller 8 outputs a word line selecting signal 12 to the row decoder 2, a sense amplifier enable signal SE to the sense amplifier section 6, the sense amplifier enable signal SE and a switch control pulse 11 to a switch control circuit 5, the column selecting signal 13 to the column decoder 7, and a data amplifier enable signal 14 to the data amplifier 9.

The switch control circuit 5 receives the sense amplifier enable signal SE and the switch control pulse 11 from the timing controller 8 to output switch circuit control signals Tg1, Tg2, Tg3, and Tg4 with which the switch circuit groups TSW1, TSW2, TSW3, and TSW4 are controlled, respectively. Circuit blocks relevant to data write are omitted from FIG. 1.

Next, FIG. 2 is a block diagram illustrating details of some of the components that are illustrated in FIG. 1, specifically, part of the row decoder 2, part of the memory cell array 1, the switch circuit groups TSW1, TSW2, TSW3, and TSW4, and the sense amplifier section 6. In FIG. 2, a word line driver circuit 22 is provided at an output part of the row decoder 2 for each word line. Out of the memory cell array 1, FIG. 2 only illustrates one word line 3, some bit lines 21, and memory cells 1-1 that are connected to the word line 3 and to the bit lines 21. Actually, a hundred and twenty-eight memory cells 1-1 (including those omitted from FIG. 2) are connected per word line 3, and are denoted by MC1 to MC128, starting from the one closest to the word line driver circuit 22.

The hundred and twenty-eight memory cells MC1 to MC128 are connected to a hundred and twenty-eight bit lines B1 to B128, respectively. The hundred and twenty-eight bit lines are divided into groups of thirty-two bit lines, and the bit lines B1 to B32 are each connected to one end of its associated switch circuit 24 in the switch circuit group TSW1. Similarly, the bit lines B33 to B64 are connected to the switch circuits 24 in the switch circuit group TSW2, the bit lines B65 to B96 are connected to the switch circuits 24 in the switch circuit group TSW3, and the bit lines B97 to B128 are connected to the switch circuits 24 in the switch circuit group TSW4. Different switch circuit control signals Tg1, Tg2, Tg3, and Tg4 are connected to the switch circuits 24 in the switch circuit group TSW1, the switch circuits 24 in TSW2, the switch circuits 24 in TSW3, and the switch circuits 24 in TSW4, respectively.

The bit lines B1 to B128 are also connected, via their associated switch circuits 24, to a hundred and twenty-eight sense amplifiers SA1 to SA128, which constitute the sense amplifier section 6. The sense amplifier enable signal SE which is common to the sense amplifiers SA1 to SA128 is connected to the sense amplifiers SA1 to SA128. The sense amplifiers SA1 to SA128 are all enabled when the sense amplifier enable signal SE is at the high level, and stop operating when the sense amplifier enable signal SE is at the low level.

Next an operation of the Semiconductor memory device in the first embodiment is described next with reference to FIG. 3, which is an operation timing chart of the first embodiment. FIG. 3 illustrates the voltage waveforms of a selected word line, the switch circuit control signals Tg1 to Tg4 of the switch circuit groups TSW1 to TSW4, the sense amplifier enable signal SE, and I/O1 to I/O128, which are buses connecting the sense amplifiers SA1 to SA128 and the column decoder 7 to each other. FIG. 3 also illustrates the waveform of a current consumed when memory cell data is read and written back.

After a word line selected by the row decoder 2 rises from the low level to the high level, the switch circuit control signals Tg1 to Tg4 reach the high level at time points t0 to t1 to turn on all the switch circuits 24 in the switch circuit groups TSW1, TSW2, TSW3, and TSW4. With the switch circuits 24 turned on, the electric potentials of the bit lines are transmitted from the memory cell array 1 to the sense amplifiers. However, at this point, the sense amplifier enable signal SE is at the low level and the sense amplifiers are not enabled. A large current therefore does not flow in the circuits. The length of time from the time point t0 to the time point t1 is long enough to fully transmit bit line electric potentials read out of the memory cells to the sense amplifiers. If the length of time from the time point t0 to the time point t1 is not long enough, bit line electric potentials read out of the memory cells cannot be transmitted to the sense amplifiers correctly. At the time point t1, the switch circuits 24 are turned off once to disconnect the sense amplifiers SA1 to SA128 from the bit lines B1 to B128. After the switch circuits 24 are turned off, a minute electric potential difference between data read out of the bit lines and a reference electric potential is still kept in the sense amplifiers SA1 to SA128.

At a time point t2, the sense amplifier enable signal SE rises from the low level to the high level to change the hundred and twenty-eight sense amplifiers SA1 to SA128 from a disabled state to an enabled state. Then, the sense amplifiers compare the electric potentials read out of the bit lines against the reference electric potential and start an amplification operation. From a time point t3, electric potential differences amplified by the sense amplifiers SA1 to SA128 start to be transmitted to the buses I/O1 to I/O128, which connect the sense amplifiers SA1 to SA128 and the column decoder 7 to each other, to charge/discharge I/O1 to I/O128. A current for the amplification operation in the sense amplifiers SA1 to SA128 and for the charging/discharging of I/O1 to I/O128 peaks at a point past the time point t3. However, because the switch circuits 24 of any of the groups TSW1, TSW2, TSW3, and TSW4 are turned off, no current flows in the bit lines B1 to B128 at this stage. The peak current is thus lowered. In addition, the bit lines B1 to B128 do not burden the sense amplifiers, which means that the buses I/O1 to I/O128 can be driven at high speed to read data to the data amplifier 9 at high speed.

At a time point t4, the switch circuit control signal Tg1 for the switch circuit group TSW1 rises from the low level to the high level to switch the switch circuits 24 in the switch circuit group TSW1 from off to on. Then, the data amplified by the sense amplifiers SA1 to SA32 is written back to the memory cells 1-1 via the bit lines B1 to B32, thereby restoring the electric charges of the memory cells that have been lost due to the readout.

The writeback at t4 is executed after the charging/discharging of I/O1 to I/O128 by the sense amplifiers' amplification operation, which is initiated by the rise of the sense amplifier enable signal SE at t2, settles and the current peak registered immediately after the readout is started at t3 drops down. If the length of time from the time point t2 to the time point t4 is too short, the current peak due to the sense amplifiers' amplification operation and the peak of the bit line charging current overlap with each other, which is not desirable. The charging of the bit lines B1 to B32 is started from the time point t4, and a peak current therefore flows immediately after the time point t4. However, as mentioned above, this peak current does not overlap with the peak current at a time point past the time point t3, where the current for the sense amplifiers' amplification operation and for reading data to the outside peaks.

At a time point t5, the switch circuit control signal Tg1 drops from the high level to the low level, whereas the switch circuit control signal Tg2 rises from the low level to the high level. In other words, the writeback to the bit lines B1 to B32 is completed at the time point t5 and writeback to the bit lines B33 to B64 is started from the time point t5. Immediately after the writeback to the bit lines B33 to B64 is started at the time point t5, a current for charging the bit lines B33 to B64 peaks. However, the time point at which the current for charging the bit lines B33 to B64 peaks does not overlap with the peak of the current for charging the bit lines B1 to B32. The time interval between the time point t4 and the time point t5 is set such that the peak currents do not overlap with each other.

Similarly, at a time point t6, the switch circuit control signal Tg2 drops from the high level to the low level to turn off every switch circuit in the switch circuit group TSW2 and to disconnect the bit lines B33 to B64 from their associated sense amplifiers SA33 to SA64, while the switch circuit control signal Tg3 rises from the low level to the high level to turn on every switch circuit in the switch circuit group TSW3 and to connect the bit lines B65 to B96 to their associated sense amplifiers SA65 to SA96, to thereby start the charging of the bit lines B65 to B96.

Further, at a time point t7, the switch circuit control signal Tg3 drops from the high level to the low level to turn off every switch circuit in the switch circuit group TSW3 and to disconnect the bit lines B65 to B96 from their associated sense amplifiers SA65 to SA96, while the switch circuit control signal Tg4 rises from the low level to the high level to turn on every switch circuit in the switch circuit group TSW4 and to connect the bit lines B97 to B128 to their associated sense amplifiers SA97 to SA128, to thereby start the charging of the bit lines B97 to B128.

Finally, at a time point t8, the switch circuit control signal Tg4 drops from the high level to the low level to turn off every switch circuit in the switch circuit group TSW4 and to disconnect the bit lines B97 to B128 from their associated sense amplifiers SA97 to SA128.

Through the procedure described above, the peak current can be lowered in a data readout operation and data writeback operation of a semiconductor memory device by staggering timing at which a current that flows to amplify data in sense amplifiers and to read the data to the outside peaks and timing at which a current that flows to write back memory cell data group by group peaks. With the current peaks dispersed in this manner, the peak current can be lowered. Data is read out of the sense amplifiers SA by enabling the sense amplifiers SA at the time point t2 and starting the data output at the time point t3. Accordingly, pushing back the writeback timing does not affect the data readout speed.

Second Embodiment

A second embodiment of the present invention is described next. The second embodiment is a modification example of the first embodiment described above, and changes the timing of the switch circuit control signals Tg1, Tg2, Tg3, and Tg4 for the switch circuit groups TSW1, TSW2, TSW3, and TSW4 from that of the first embodiment. The second embodiment has substantially the same circuit structure as the one in the block diagrams of FIGS. 1 and 2, which illustrate the first embodiment. The difference is that, in the second embodiment, the operation timing of the switch circuit control signals Tg1, Tg2, Tg3, and Tg4 output from the switch control circuit 5 of FIG. 1 differs slightly from the one in the first embodiment.

Figure 4:
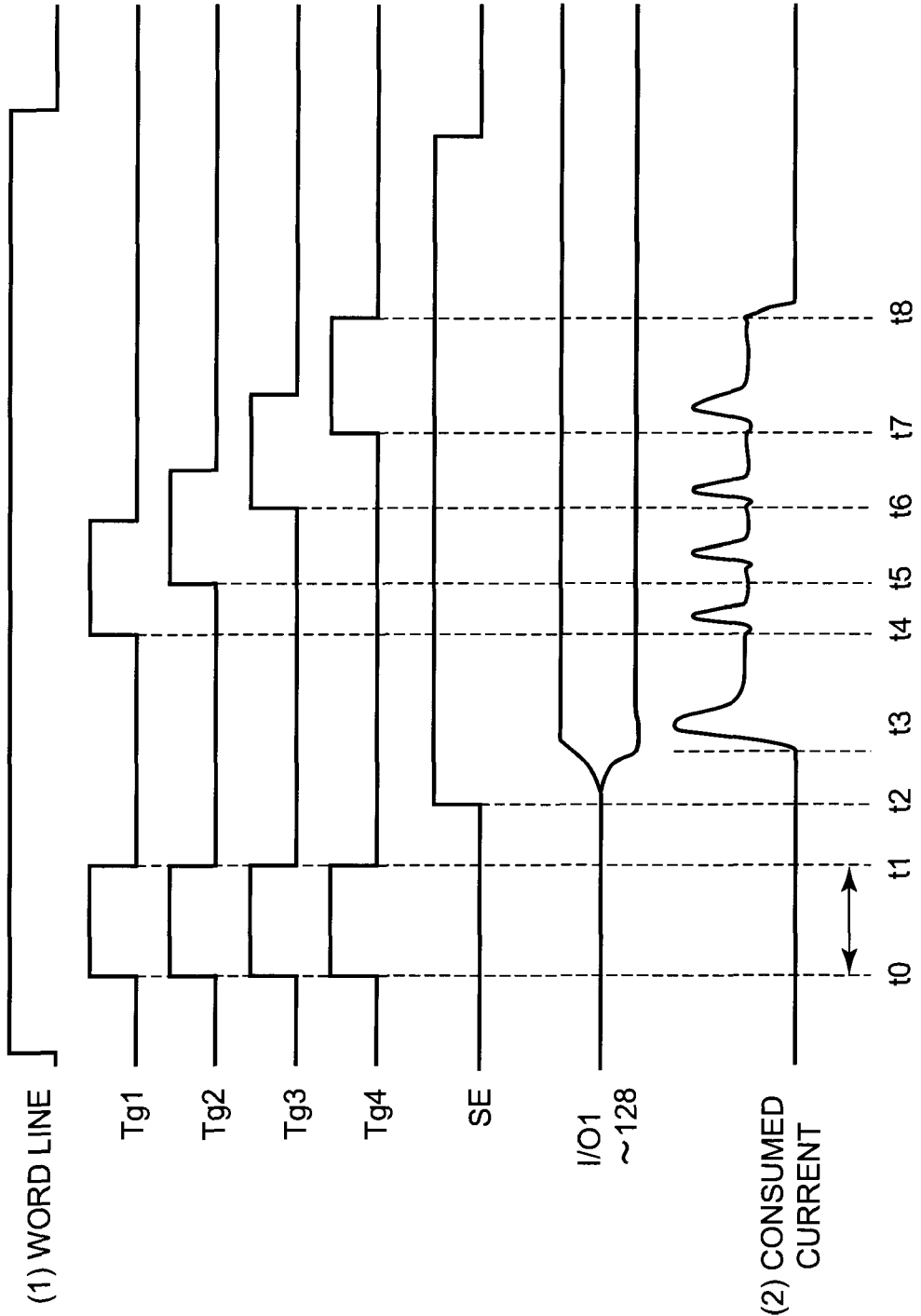
FIG. 4 is a timing chart of a semiconductor memory device according to a second embodiment of the present invention.

FIG. 4 is an operation timing chart of a semiconductor memory device according to the second embodiment. Compared to FIG. 3, which is an operation timing chart of the first embodiment, the operation of the semiconductor memory device in FIG. 4 is the same as in FIG. 3 from the time when the word line rises first till the time point t4 is reached. The operation in FIG. 4 slightly differs from the operation in FIG. 3 from the time point t4 on. In FIG. 3, the switch circuits 24 of a preceding group are closed before the switch circuits 24 of the next group are opened so that the switch circuits 24 of different groups are not turned on simultaneously. In FIG. 4, on the other hand, the switch circuits 24 of the switch circuit group TSW1 and the switch circuits 24 of the switch circuit group TSW2, for example, are concurrently open at the time point t5, where the switch circuit control signal Tg2 is changed to the high level but the switch circuit control signal Tg1 maintains the high level. However, the time interval between the time point t5, where the switch circuit control signal Tg2 rises to the high level, and the time point t4, where the switch circuit control signal Tg1 rises to the high level, is wide enough to avoid an overlap of time periods in which peak currents flow. The peak current can therefore be lowered. The time interval between a time point where the switch circuit control signal Tg3 rises and a time point where Tg4 rises is similarly set wide.

Further, according to the second embodiment, the switch circuits in one group are not turned off immediately after the charging of the bit lines of another group starts, while peak currents are staggered to avoid an overlap. The bit line charging can thus be continued and peak currents are staggered by a shorter length of time than in the first embodiment. As a result, the overall length of time in which a word line is active is cut short, and current consumption is reduced even more. The timing of enabling sense amplifiers for readout in the second embodiment is the same as in the first embodiment, and the readout speed is therefore the same as in the first embodiment.

Third Embodiment

FIG. 5 is a timing chart of a third embodiment, which is another modification example of the first embodiment. Operation timing in FIG. 5 is the same as in the first embodiment, except for the operation timing of the switch circuit control signals Tg1, Tg2, Tg3, and Tg4 output from the switch control circuit 5. Accordingly, FIGS. 1 and 2, which are block diagrams of the first embodiment, apply to the third embodiment as they are. Compared to FIG. 3, the operation of the semiconductor memory device in FIG. 5 is the same as in FIG. 3 till the time point t4. From the time point t4 on, whereas, in FIG. 3, the switch circuits of a previously turned on group are turned off before the switch circuits of the next group are turned on, the period of time in which the switch circuits of each group are on is extended in the third embodiment to the time when the word line drops. Because the switch circuits are kept turned on until the word line drops and the sense amplifiers keep driving their respective bit lines until the word line drops, the third embodiment has an advantage of being less susceptible to the influence of noise or the like over the first and second embodiments.

FIG. 6 is a block diagram illustrating a structural example of the switch control circuit 5 according to the third embodiment. The switch control circuit of FIG. 6 receives the switch control pulse 11, which is generated by a pulse generating circuit 31 and serves as a reference, and the sense amplifier enable signal SE to generate the switch circuit control signals Tg1, Tg2, Tg3, and Tg4. The pulse generating circuit 31 is a part of the functions of the timing controller 8 of FIG. 1. When the sense amplifier enable signal SE is inactive, transfer gates T2 to T4 are turned off and, accordingly, the signals Tg1 to Tg4 have the same timing pulse synchronized with the switch control pulse 11. When the sense amplifier enable signal SE is active, on the other hand, the transfer gates T2 to T4 are turned on and the signals Tg2 to Tg4 rise at time points that are determined by the delay time lengths of delay circuits 40 to 42. The signals Tg2 to Tg4 drop at substantially the same time as the switch control pulse 11 drops.

Fourth Embodiment

FIG. 7 is a block diagram illustrating an entirety of a semiconductor memory device according to a fourth embodiment of the present invention. Compared to FIG. 1, which is a block diagram illustrating the semiconductor memory device of the first embodiment in its entirety, the sense amplifier section 6 of FIG. 7 is divided into four groups, 6-1, 6-2, 6-3, and 6-4, which correspond to the switch circuit groups TSW1 to TSW4. Further, the sense amplifier section 6 and the timing controller 8 are wired such that different sense amplifier enable signals SE1 to SE4 are connected to different sense amplifier groups 6-1, 6-2, 6-3, and 6-4. The group-by-group sense amplifier enable signals are also connected to a switch control circuit 55, which generates group-by-group switch circuit control signals from the switch control pulse 11 and from the group-by-group sense amplifier enable signals. The rest of the structure in FIG. 7 is substantially the same as in FIG. 1. In the fourth embodiment, blocks that have substantially the same structures and functions as those in the first embodiment are denoted by the same reference numbers and their descriptions are omitted.

FIG. 8 is a block diagram illustrating a part of the structure of FIG. 7 that is relevant to the sense amplifiers 26 and the switch circuits 24. FIG. 8 is the same as FIG. 2 which illustrates the first embodiment, except that different sense amplifier enable signals (SE1 to SE4) are connected to different groups of the sense amplifiers SA1 to SA128.

FIG. 9 is an operation timing chart of the fourth embodiment. FIG. 9 differs from FIG. 3, which is a timing chart of the first embodiment, in that the sense amplifiers are enabled group by group. In the fourth embodiment, the readout operation is executed group by group at staggered time points in addition to the writeback operation. The peak current in the fourth embodiment is therefore lowered even more than in the first to third embodiments.

The number of switch circuits contained per group, the number of cells that are read concurrently, and the number of sense amplifiers can be determined to suit the specifications of the product. The switch circuits in the embodiments described above are divided into four groups, but the present invention is not limited thereto. While increasing the number of groups means more layout limitations, it lowers the peak current more and leads to low power consumption. What structure is to be employed can be determined from, for example, how many cells connected to one word line are to be read concurrently, and from the specifications of the product including access speed and power consumption.

A semiconductor memory device of the present invention can be a memory that is formed on a one-chip semiconductor substrate as a part of the functions of a system LSI, together with other function macros.

Hereinabove, the present invention has been described through embodiments. However, the present invention is not limited to the structures of the embodiments described above, and includes variations and modifications that could be made by the skilled in the art within the scope of the present invention.

What is claimed is:

1. A semiconductor memory device including:
a plurality of word lines;
a plurality of bit lines which are provided in a direction intersecting the plurality of word lines;
a plurality of memory cells which are arranged in a matrix pattern that corresponds to intersections between the plurality of word lines and the plurality of bit lines;
a plurality of sense amplifiers which are associated with the plurality of bit lines on a one-on-one basis;
a plurality of switch circuits each of which belongs to one of first to n-th (n is an integer equal to or larger than 2) groups, and which are associated with the plurality of bit lines and with the plurality of sense amplifiers on a one-on-one basis, each switch circuit connecting its associated bit line and sense amplifier to each other when turned on; and
a timing control section for controlling at least timing of the sense amplifiers and the switch circuits which, in reading stored data out of the memory cells, executes control in which the plurality of sense amplifiers are disabled while the plurality of switch circuits are turned on for a given period of time, the plurality of switch circuits are turned off and then the plurality of sense amplifiers are enabled, and, when a given period of time elapses since the relevant sense amplifiers are enabled, the switch circuits belonging to the first to n-th groups are sequentially turned on group by group at given time intervals.

2. A semiconductor memory device according to claim 1, wherein the timing control section executes control in which, when a given period of time elapses since the sense amplifiers are enabled, the switch circuits belonging to the first to n-th groups are sequentially turned on group by group at given time intervals, and the switch circuits belonging to the first to n-th groups are turned off when a given period of time elapses since the switch circuits that belong to the last group are turned on.

3. A semiconductor memory device according to claim 1, wherein, in turning on the switch circuits belonging to the first to n-th groups sequentially group by group at given time intervals, the timing control section executes control in which the switch circuits of a preceding group are turned off before the switch circuits of the next group are turned on, so that a time period in which the switch circuits of one group are on is prevented from overlapping with a time period in which the switch circuits of another group is on.

4. A semiconductor memory device according to claim 1,
wherein each of the plurality of sense amplifiers belongs to one of first to n-th groups that corresponds to the switch circuit group of its associated switch circuit, and
wherein the timing control section executes control in which, after the plurality of switch circuits are turned off, the sense amplifiers are sequentially enabled group by group at given time intervals, and, when a given period of time elapses since the sense amplifiers of one group are enabled, the switch circuits of the corresponding group are turned on.

5. A semiconductor memory device according to claim 4, wherein, in sequentially enabling the sense amplifiers group by group at given time intervals, the timing control section turns off the sense amplifiers and switch circuits belonging to a group whose sense amplifiers are previously enabled, and then enables the sense amplifiers of the next group.

6. A semiconductor memory device according to claim 1, wherein the semiconductor memory device comprises a dynamic random access memory.

7. A semiconductor memory device according to claim 1,
wherein the timing control section includes a timing controller and a switch control circuit,
wherein the timing controller generates a sense amplifier enable signal, which controls enabled/disabled state of the sense amplifiers, and a switch control pulse, which serves as a reference for on/off of the switch circuits, and
wherein the switch control circuit controls the on/off of the plurality of switch circuits group by group, based on the sense amplifier enable signal and the switch control pulse.

8. An operation method of a semiconductor memory device comprising: a plurality of word lines; a plurality of bit lines which are provided in a direction intersecting the plurality of word lines; a plurality of memory cells which are arranged in a matrix pattern that corresponds to intersections between the plurality of word lines and the plurality of bit lines; a plurality of sense amplifiers which are associated with the plurality of bit lines on a one-on-one basis; and a plurality of switch circuits which, when turned on, connect the plurality of bit lines and the plurality of sense amplifiers to each other, the method comprising:
disabling the plurality of sense amplifiers while turning on the plurality of switch circuits for a given period of time;
turning off the plurality of switch circuits and then enabling the plurality of sense amplifiers; and
when a given period of time elapses since the sense amplifiers are enabled, dividing the plurality of switch circuits into a plurality of groups so that the switch circuits are sequentially turned on group by group at given time intervals.

9. A semiconductor memory device operation method according to claim 8,
wherein the semiconductor memory device comprises a destructive readout semiconductor memory device, and
wherein the operation comprises a readout operation and a data writeback operation which accompanies the readout operation.

* * * * *